United States Patent [19]

Chance et al.

[11] 4,452,250
[45] Jun. 5, 1984

[54] NMR SYSTEM FOR THE NON-INVASIVE STUDY OF PHOSPHORUS METABOLISM

[76] Inventors: Britton Chance; John S. Leigh; Scott M. Eleff, all of Johnson Research Foundation, School of Medicine University of Pennsylvania, Philadelphia, Pa. 19104

[21] Appl. No.: 373,283

[22] Filed: Apr. 29, 1982

[51] Int. Cl.³ .............................................. A61B 5/05
[52] U.S. Cl. ..................................... 128/653; 324/311
[58] Field of Search ................................ 128/653, 630; 324/309–312, 318, 322

[56] References Cited

U.S. PATENT DOCUMENTS 3,792,345  2/1974  Hawkins .............................. 324/307
4,191,919  3/1980  Haney et al. ......................... 324/307
4,354,499  10/1982  Damadion ........................... 128/653

OTHER PUBLICATIONS

Hutchison, J. M. S. et al., "A Whole Body NMR Imaging Machine," Jrul. of Phys. E.: Sci. Instrum., vol. 13, No. 9, Sep. 1980.
Mansfield, P. et al., "Fast Scan Proton Density Imaging by NMR," Journal of Phys. E.: Scientific Instr. 1976, vol. 9.

Primary Examiner—Kyle L. Howell
Assistant Examiner—Francis J. Jaworski
Attorney, Agent, or Firm—Herman L. Gordon

[57] ABSTRACT

A nuclear magnetic resonance analytic apparatus for obtaining tissue metabolism information from a living body member. The apparatus consists of a large high-intensity electromagnet with an inner space having a uniform magnetic field, for receiving the body member. The space has a probe coil mounted therein with which the body member is engageable. For phosphorus-31 metabolite, there is provided a 24.33 MHz RF generator connected through a control logic section and a driver unit to the probe coil via a transmitter/receiver switching unit arranged to in effect switch the probe coil from a normal connection with a demodulation circuit to the driver unit responsive to a burst of RF pulse energy applied to the switching unit by the driver unit via the control logic section by command of a computer. The control logic section controls the system so as to first apply short pulses of the RF signal to the probe coil for a predetermined excitation time period, gating-off the demodulation unit. After this excitation period, the transmitter circuit is disabled, the demodulation circuit is gated-on, and the switching unit restores the normal connection of the probe coil to the demodulation unit, allowing the free induction decay signals sensed by the probe coil to be demodulated and furnished in analog form to the computer, which converts these analog signals into representations of the intensities versus frequency shift of the respective metabolite components of the tissue. Means is provided for applying a predetermined simulated free induction decay signal to the demodulation circuit for testing the apparatus.

14 Claims, 15 Drawing Figures

PHOSPHORUS SYSTEM

SYSTEM TIMING DIAGRAM

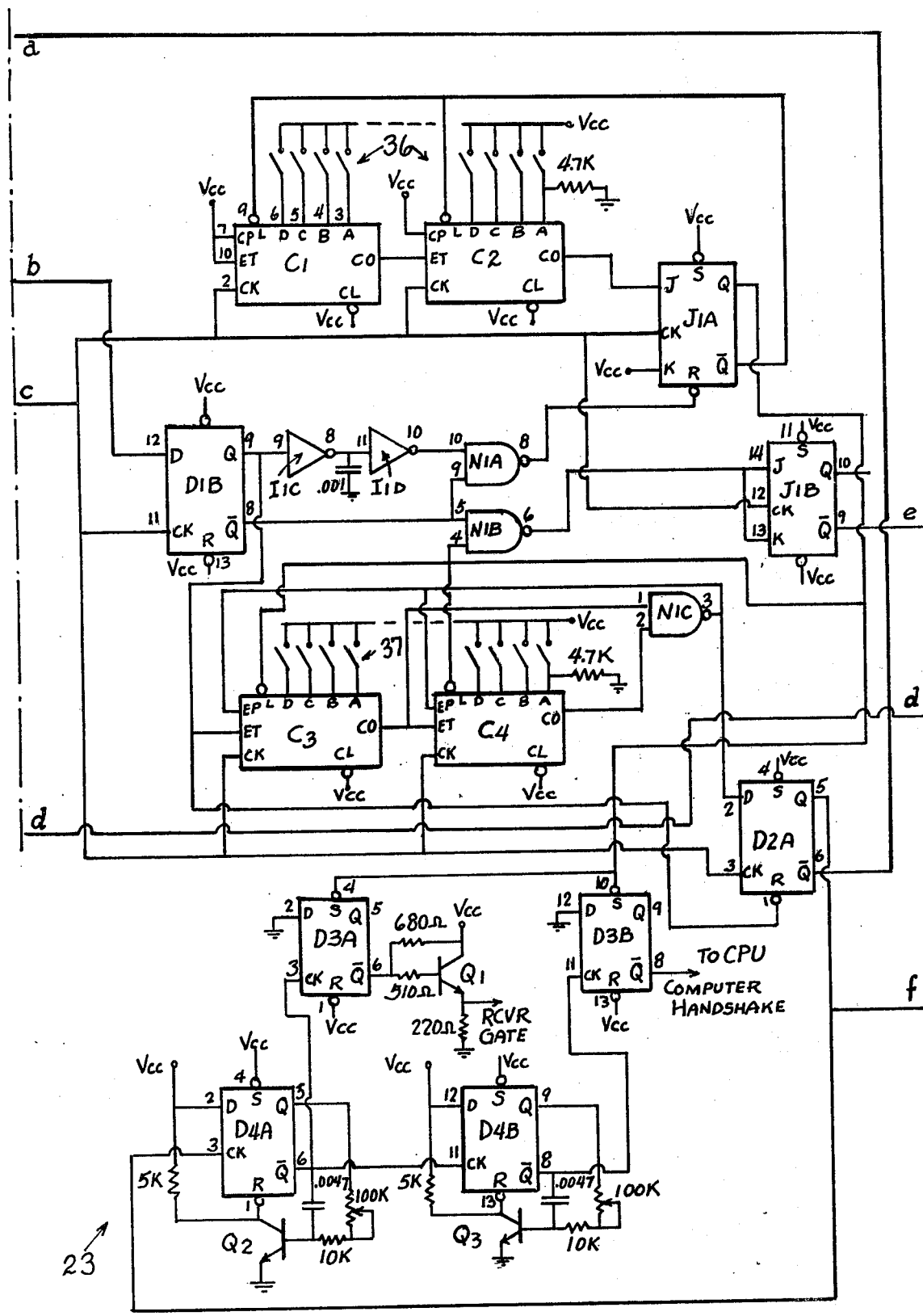
FIG. 7B     CONTROL LOGIC

RF AMPLIFIER SCHEMATIC

DRIVER SCHEMATIC

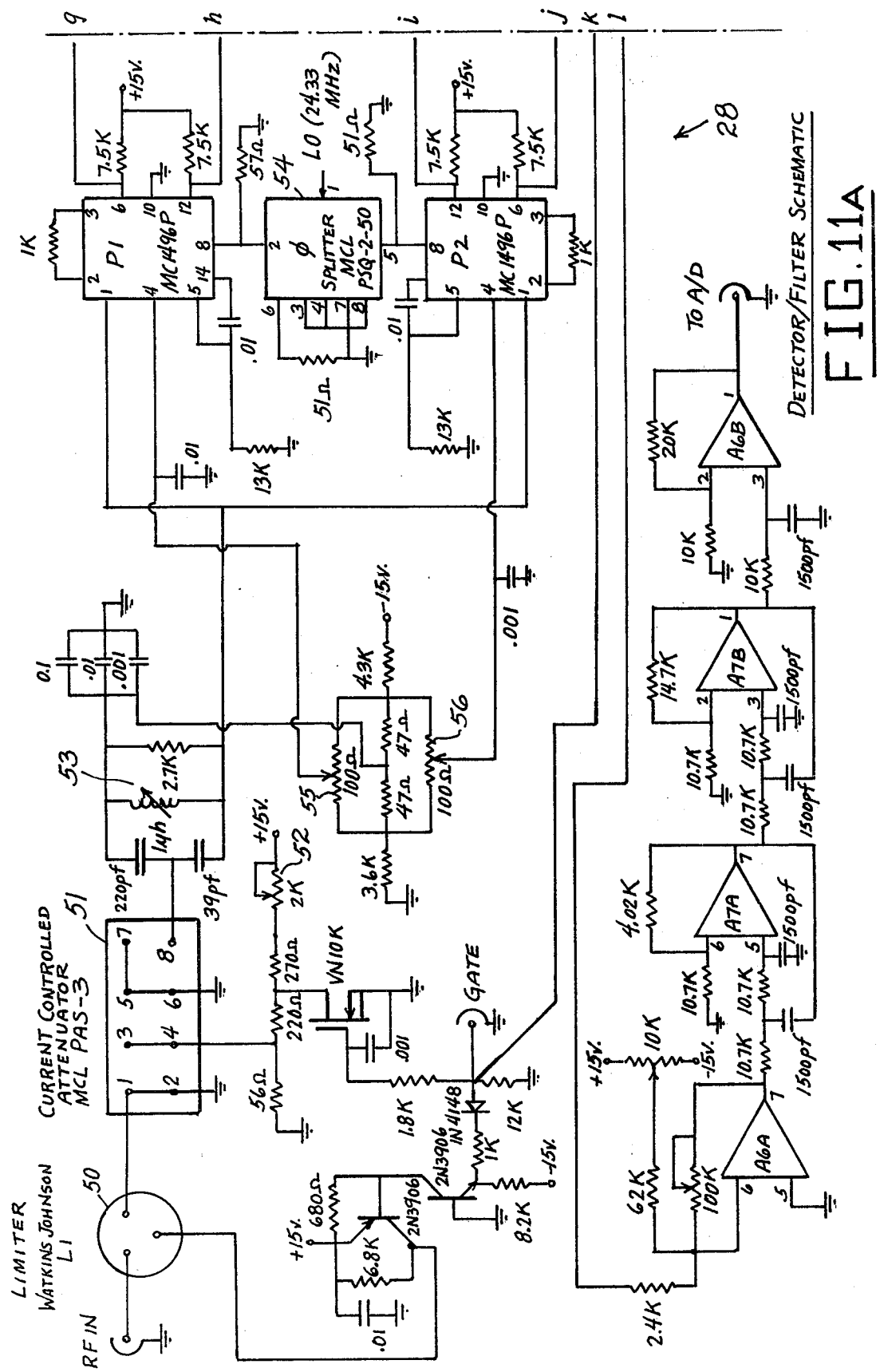

Detector/Filter Schematic

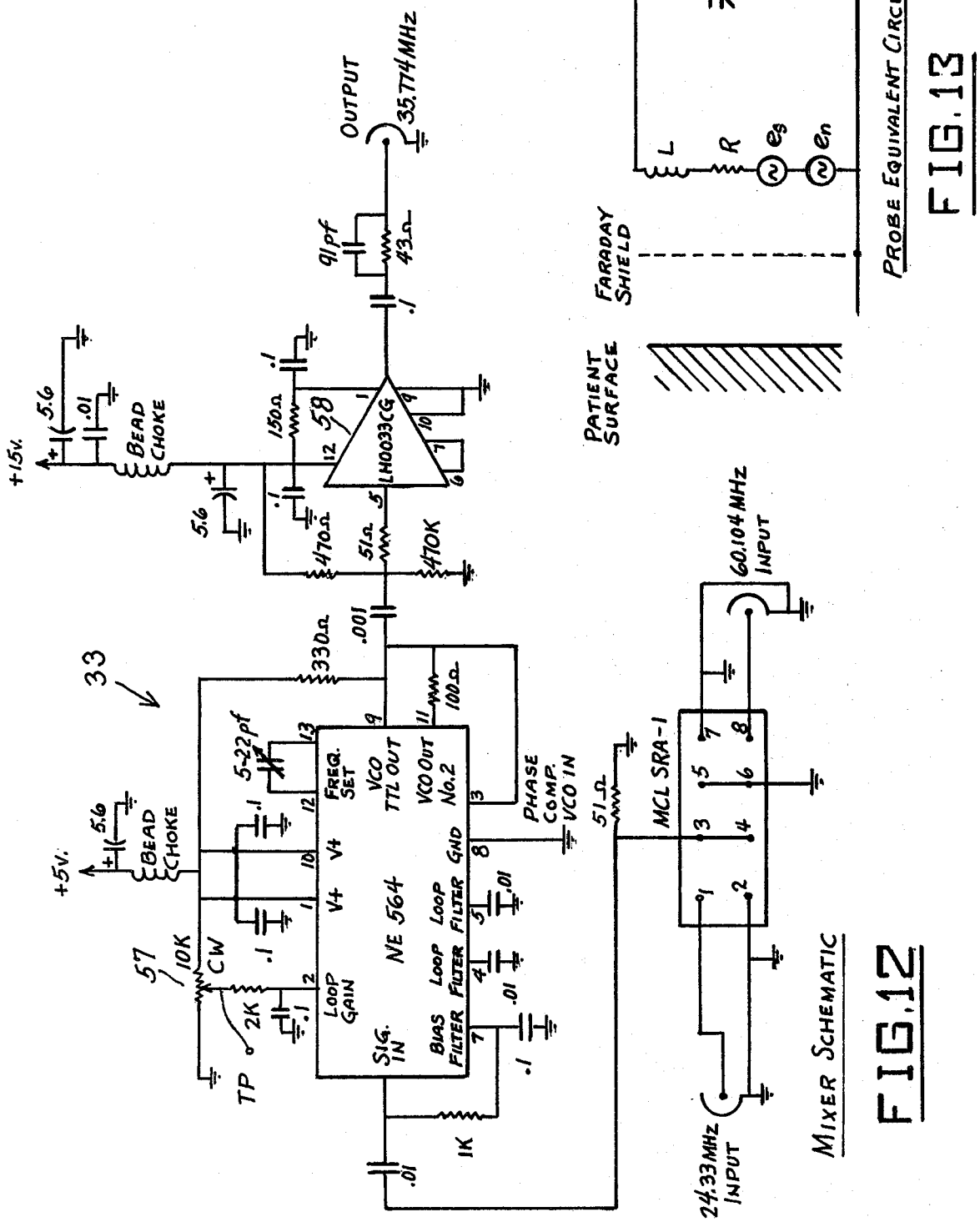

NMR SYSTEM FOR THE NON-INVASIVE STUDY OF PHOSPHORUS METABILISM

FIELD OF THE INVENTION

This invention relates to non-invasive systems for obtaining medically and scientifically significant information from the human body, and more particularly to an improved nuclear magnetic resonance transmitter/receiver system for the non-invasive study of phosphorus metabolism in human beings.

BACKGROUND OF THE INVENTION

Nuclear magnetic resonance (NMR) offers the opportunity of selectively examining the nature and function of nuclei of atoms attached to a variety of important biochemicals, of which phosphorus and carbon appear to be currently the most useful, and are pivotal in cell metabolism as well. Nuclear magnetic resonance can most simply be described as a pulsed nuclear clock, the rate of which is sensitively dependent upon the chemical environment of the particular nucleus. For example, the atoms of phosphorus, which are attached to a series of key energy-related compounds of the body, give an appropriate signature, where the important phosphate compounds in the brain, heart, kidney, liver, and skeletal tissues are the high energy compounds, ATP, the "energy currency" of the body, and creatine phosphate, the "short-term energy reserve" of the body, together with low energy forms of these compounds, adenosine diphosphate and inorganic phosphate. In addition, the sugar phosphate derived from the metabolic pathway activated by glucose metabolism can also be found (F6P, DPG).

In the past there have been numerous problems in applying NMR to tissue under the proper conditions, and in collecting and interpreting the resultant electrical data.

SUMMARY OF THE INVENTION

The problem of applying NMR to tissue has been solved by employing a special transmitting and receiving coil, upon which the tissue or organ to be examined lies. This is within the uniform field of a large and powerful magnet. Such a magnetic field must be uniform to a degree of better than one part per million to obtain the desired results.

The superposition of higher order magnetic field gradients onto the main magnetic field gives a central region of uniform field, in which inhomogeneities are less than one part per million, found to be adequate for resolving the line widths of the phosphorus compounds of energy metabolism. It is within this homogeneous field that the tissue volume under observation will be sensitively recorded; signals from other portions of the tissue will not be detectable.

In order to obtain the absorption spectra of all the phosphorus metabolites, a radio frequency pulse signal is delivered to the nuclei, which signal contains a wide range of frequencies simply by its pulse nature and therefore is appropriate to excite all the phosphorus nuclei within the tissue. Shortly after the termination of the pulse, the receiver sensitivity achieves its maximum value and "listens" for the spins of the several different phosphorus nuclear clocks within the tissue volume. By a Fourier-transform deconvolution, a chart of frequency of the clock versus intensity of the signal is presented. Since the signal intensity is determined by the number of nuclei that are spinning, the measurement is absolute in the sense that the radio frequency signal received is directly proportional to the number of nuclei responding to the radio frequency pulse; thus a comparison of the amounts of two of the components is highly precise, and integration of the area under the various signal peaks can give the absolute concentration of the species.

There are two problems of quantitation: the molecule involved may be bound in a state in vivo unexpected from in vitro studies. Creatine phosphate, however, does not have a significant affinity for intracellular constituents and NMR may therefore afford means of ready evaluation of its concentration. Similarly, phosphate is a highly dissociated anion, but the freely diffusable, highly reactive phosphate anion ($HPO_4^{2-}-H_2PO_4^{1-}$) may be precisely assayed. The sugar phosphate present as a consequence of glucose metabolism is similarly unaffected by binding. The binding of ATP to magnesium may alter the line width and position of the signal. However, the transition between the two forms of phosphoric acid caused by changes of intracellular pH can lead to significant changes of peak position (but not of signal strength) which can be interpreted in terms of the important intracellular parameter (pH) and used clinically as the degree of lactic acidosis in ischemic/anoxic tissues.

The second problem is that of allowing adequate time for relaxation of the nuclear spins prior to the next radio frequency pulse. Experiments have shown that the relatively slow relaxation times of CrP, ATP, etc., observed in test tubes do not apply precisely to the living tissues where paramagnetic ions or other species hasten the relaxation process. Thus, the time interval between radio frequency pulses can be as short at tens and twenties of milliseconds under in vivo conditions, a possibility which greatly reduces the time for the accumulation of a PNMR tissue spectrum. With appropriate attention to these conditions, quantitative assays of the energy-related phosphate compounds can be obtained.

The use of oxygen transported by hemoglobin to peripheral tissues, its diffusion through the capillaries to the intracellular mitochondria, and their functional response to utilize this oxygen to manufacture ATP and to convert it into creatine phosphate by NMR is a process which can be followed dynamically by optical techniques indicating mitochondrial response to both the presence of oxygen and to the existence of the energy demand. However, the function of mitochondria in producing ATP, and thence creatine phosphate, is not indicated by the optical method, and it is here that a unique feature of NMR becomes of primary importance, i.e., the capacity of mitochondrial oxidative metabolism to cope with the skeletal energy dissipative functions of physiological, or indeed, pathological nature.

Accordingly, a main object of the invention is to provide an improved non-invasive system for obtaining significant information from the human body which overcomes the deficiencies and disadvantages of previously employed non-invasive systems for achieving this purpose.

A further object of the invention is to provide an improved non-invasive system for the non-invasive study of phosphorus metabolism in human beings, said system utilizing nuclear magnetic resonance for gathering biochemical information about the metabolic state of a patient's tissues, particularly in relation to phosphorus-31 compounds involved in energy storage and release.

A still further object of the invention is to provide an improved NMR transmitter/receiver system for the non-invasive study of phosphorus metabolism in human beings, the system being relatively compact in size, being reliable in operation, and being particularly well adapted for in vivo studies of phosphorus metabolism in human tissues, said system employing a novel and improved pulse transmitter and receiver arrangement for studying phosphorus metabolism at 24.3 MHz but being readily adaptable for studying other nucleii or phosphorus at other frequencies.

BRIEF DESCRIPTION OF THE DRAWINGS

Further objects and advantages of the invention will become apparent from the following description and claims, and from the accompanying drawings, wherein:

FIGS. 7A, 7B and 7C taken together constitute a wiring diagram of the control logic component of a system such as that shown in FIG. 4 or FIG. 5.

FIGS. 11A and 11B, taken together, constitute a wiring diagram of the demodulator and filter components employed in FIG. 4 or FIG. 5.

FIG. 12 is a wiring diagram of a mixer employed in the proton system of FIG. 5.

FIG. 13 is a diagram showing the equivalent circuit of a probe component employed in the apparatus of the present invention.

DETAILED DESCRIPTION OF A PREFERRED EMBODIMENT

Figure 1:
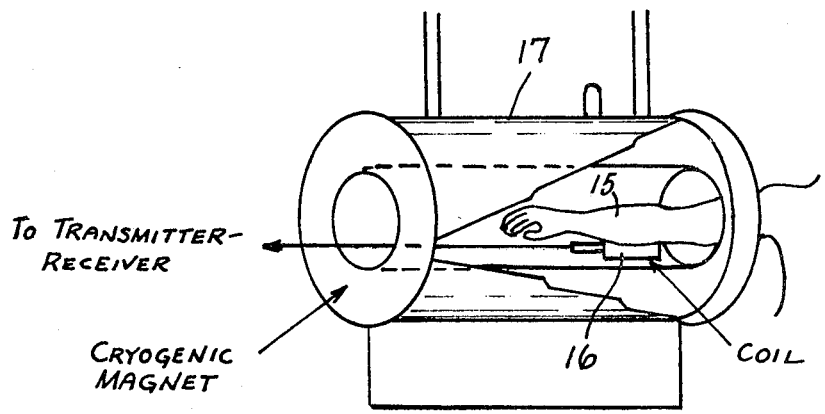
FIG. 1 is a diagrammatic perspective view showing a human arm resting upon a probe in a homogeneous magnetic field of a nuclear magnetic resonance analytical apparatus forming part of an improved phosphorus metabolism study system according to the present invention.
Figure 2:
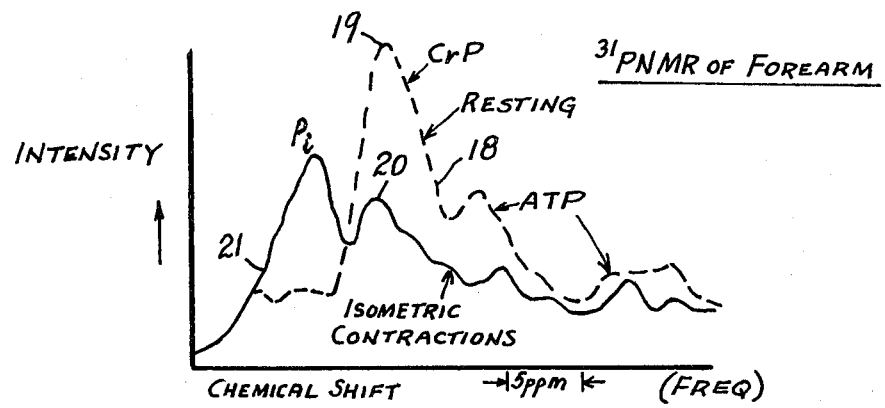
FIG. 2 shows typical curves obtainable from the system depicting the intensities of the phosphorus-containing components of the muscle constituents of the human arm of FIG. 1, respectively for a resting state and a state resulting from isometric contraction.

FIG. 1 is a diagrammatic view of a human arm 15 resting on the probe 16 of the NMR analytical apparatus, said probe being suitably mounted within the large cryogenic magnet coil 17 of the apparatus, shown partly broken away, within the homogeneous magnetic field thereof. The resting state of the muscle phosphorus-containing constituents is depicted by the dotted curve 18 of FIG. 2. This curve identifies a large concentration of creatine phosphate (CrP) with a peak 19. The CrP peak 19 is shown at a chemical shift with respect to phosphoric acid of about 5 parts per million in frequency. Repetitive contractions of the muscle, caused simply by clenching the fist of the person, causes a rapid utilization of creatine phosphate, as indicated by the decline of this peak (shown at 20 in the full-line isometric contraction curve 21), and the formation of an equivalent amount of inorganic phosphate $P_i$ (see Equation 2 below), and its reaction with adenosine phosphate produces ATP, which is immediately used in muscle function to produce ADP and inorganic phosphate (Equation 3, below), and the ADP is ultimately regenerated to ATP by oxidative phosphorylation (Equation 1, below):

Oxidative Phosphorylation:

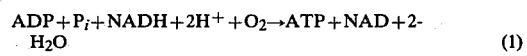

$$ADP + P_i + NADH + 2H^+ + O_2 \rightarrow ATP + NAD + 2\text{-}H_2O \qquad (1)$$

"Energy Reserve":

$$Cr + ATP \leftrightarrow CrP + P_i \qquad (2)$$

"Energy Currency":

$$ATP \leftrightarrow ADP + P_i \qquad (3)$$

Thus, it is possible in one simple study to follow the speed and efficiency of the muscle energy metabolism.

Important uses of this technique include: (1) Determining if the oxygen supply to the muscle meets the needs of a function. This is the problem which is accentuated by peripheral vascular disease where the blood vessel patency is insufficient for an adequate supply of oxygen. Creatine phosphate may be deficient in the resting state, or the mitochondrial metabolism may be unable to maintain a sufficient level of creatine phosphate during a given exercise regime. (2) The second aspect is that insufficiency of the creatine phosphate and oxygen supply may be present for dealing with a given amount of exercise, for example, as in a training regime where selective exercises have increased the muscle mass and may or may not have appropriately increased the essential energy metabolism. In this case, a selective exercise can evoke changes of creatine phosphate which tell (a) if the energy metabolism is fully active, and (b) if the energy supply can sustain the muscle during a given amount of athletic work.

Alternatively, the capability of a muscle suspected of a dystrophy can be evaluated in a quantitative and non-invasive manner not previously possible without biopsy. Last, but by no means least, with the feeding of the stable isotope carbon 13, the ability of the tissue to use glucose under the influence of natural or therapeutically-supplied amounts of insulin could be evaluated similarly in the arm muscle during rest or exercise.

Figure 3:
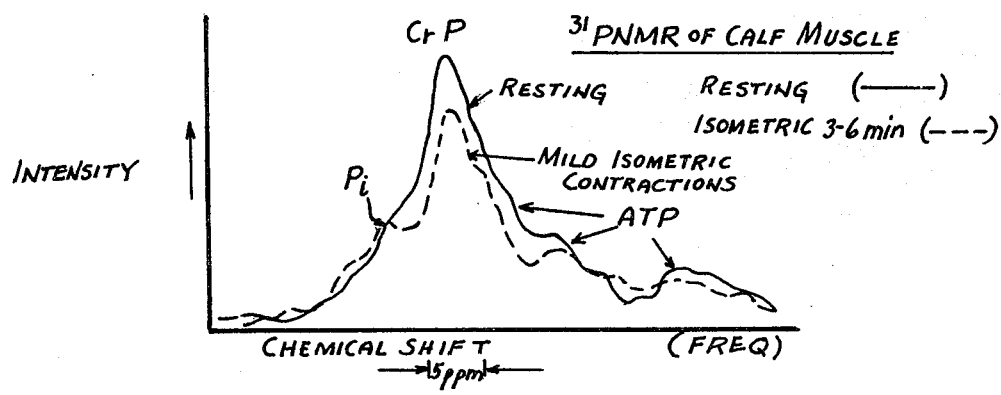
FIG. 3 shows similar typical curves obtainable from the system depicting the intensities of the phosphorus-containing components of a human calf of a leg inserted in the apparatus, respectively for a resting state and a state resulting from mild isometric contractions.

Particularly in the study of peripheral vascular disease, the leg muscles may be of considerably more interest. The leg can be inserted into a 7" magnet in a manner similar to FIG. 1. Typical curves obtainable by the use of the NMR analytical instrument in the study of the metabolism of the human calf muscle are shown in FIG. 3, where the high creatine phosphate and the low phosphate levels, determined to be characteristic of healthy tissue, are similar to those of animal skeletal tissue. Modest contractions of the calf muscle show, however, an immediate decrease of creatine and a rise of inorganic phosphate. In the two cases, the ratio of the amplitude of the creatine phosphate to phosphate peaks is about of the order of 20:1 or greater, for resting states, whereas mild exercise gives a ratio of $CrP/P_i$ of about 6:1. This ratio can be termed the "$CrP/P_i$ index". Extreme exercise would have produced massive changes of the index, such as possibly to about 1:1.

The apparatus of the present invention is therefore mainly for the purpose of gathering biochemical information about the metabolic state of the patient's tissues. The chemical compounds to be particularly studied are phosphorus compounds involved in energy storage and release. The apparatus is also applicable for studies of human metabolism and disease, using NMR of sodium-23, carbon-13, fluorine-19, and probably other magnetic nucleii, including protons. The presently described apparatus comprises in particular an NMR system including a pulse transmitter and receiver circuit designed to study phosphorus metabolism at 24.3 MHz.

Figure 4:
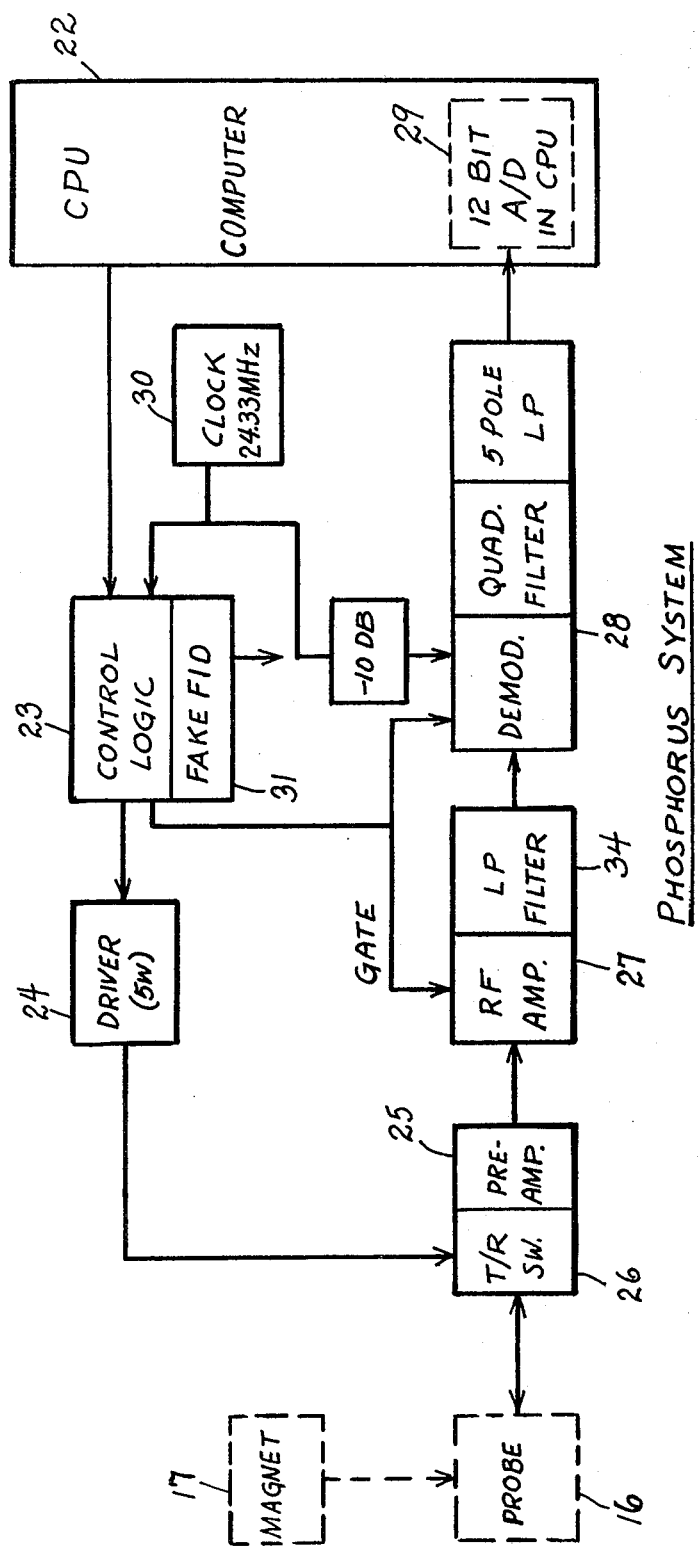
FIG. 4 is a block diagram showing the major system components of an apparatus according to the present invention, specifically for the study of the phosphorus-containing constituents.

The major system components and their interrelation are shown in the block diagram of FIG. 4. The system design is specific for use with a static magnetic field of 1.4T (14 kilo-gauss) but may be scaled for other field strengths. At 1.4T, the resonances of phosphorus and protons are in the order of 24.33 MHz and 60.1 MHz, respectively.

Referring to FIG. 4, the sample acquisition period is started and terminated by the computer (CPU), the repetition rate and duration being under user control. The computer is designated generally at 22. The only constraints on this user adjustment is that enough time must be allowed to permit the control logic to complete its timing cycles with regard to both the repetition rate and the duration.

The control logic will be presently explained in detail. Suffice it to say that, using the clock as a reference and under control of the CPU, the logic gates-off the receiver circuits and applies a predetermined number of cycles of the clock to the driver circuit. The control logic is shown generally at 23 and the driver is shown generally at 24. The driver 24, through the Transmit/Receiver (T/R) Switch 26, applies this RF to the probe coil 16 to rotate the spin axis of the species of interest out of alignment with the static field. The clock is shown at 30.

Following the transmit portion of the cycle, the T/R switch 26 and logic 23 allow the receiver portion of the system to become active. The Free Induction Decays (FID) of the species of interest induce a minute signal in the probe 16 which is then amplified, detected and filtered by the receiver portions of the system, the output of which is an analog of the composite FID. The receiver portions include the preamplifier 25, the RF amplifier 27, low pass filter 34, and the demodulator, quad filter and 5-pole low pass filter 28.

The analog data is converted to digital form and acquired by the computer 22. In this typical design the conversion takes place in the 12-bit analog-to-digital converter 29, which is part of the computer 22. After a sufficient number of samples are acquired and averaged to improve signal-to-noise ratio, a Fourier transform is performed to separate the frequency components of the signal. Since the receiver demodulator uses the clock 30 as a reference, the transformed spectrum is in terms of deviation from the clock frequency, and the magnitude (or area under the peaks) is a measure of the relative abundance of the various species.

The control logic 23 includes a "fake FID" section 31 to generate a "fake FID" at the receiver time for testing and adjusting the system. The output of an impulse-excited high-Q filter is mixed with the clock output to yield a double-sideband suppressed-carrier signal, which is centered about the clock frequency and is an exponentially decaying 1 kHz sine wave. This signal simulates the FID of a single species at 1 kHz from the carrier and may be applied to the demodulator input for test and alignment in place of the LP filter output of section 34. Similarly, with suitable attenuation, it may be applied either to the RF amplifier input or the T/R Switch input to test these system elements.

The static magnetic field homogeneity limits the ability to separate the peaks of the phosphorus species. A homogeneity of the order of one part in $10^7$ is desirable but extremely difficult to measure. The signal-to-noise ratio with phosphorus is so poor that it requires much averaging to extract any signal, so a determination of homogeneity cannot be made with the phosphorus signal. However, since the relative abundance of protons is 80 dB greater, the decay time of a proton FID is a good measure of homogeneity and can be observed in real time at the receiver output with an oscilloscope. This observation must be made with the probe coil 16 and sample in place exactly as it would be for the phosphorus measurement, since both will influence the homogeneity. For the field strength of this design, the proton measurement must be made at 60.10 MHz as opposed to 24.33 MHz for phosphorus. A separate laboratory spectrometer tuned to 60.10 MHz can be used to observe FID decay time, but this is quite cumbersome and costly. The NMR apparatus can be modified to permit detection of either frequency, and this is included in the modified system shown in FIG. 5.

To observe the proton FID, it is necessary to use a 60.10 MHz clock 32 as the input to the logic circuit in order to obtain this frequency as an input to the driver 24 and probe 16 for rotation of proton spins. The resulting 60.10 MHz proton signal is attenuated considerably by the probe coil 16 and RF section tuning, but this is more than offset by the higher signal strength. Further attenuation may need to be inserted at the pre-amp or LP filter output to prevent saturation.

The 24.33 MHz clock 32 is used as the demodulator reference, as with phosphorus and is also applied to the mixer circuit 33 along with the 60.10 MHz clock signal. The resulting 35.77 MHz signal is applied to the mixer injection port between the RF amplifier 27 and its LP filter 34. When mixed with the 60.10 MHz FID signal, this yields a 24.33 MHz signal, which is the frequency for which the LP filter 34 and demodulator 28 are tuned. By using this second clock 32 and the mixer 33, it is possible to use the same spectrometer for either phosphorus or protons with only a slight change in the way the system components are connected together, namely, in the manner shown in the block diagram of FIG. 5.

CONTROL LOGIC

Figure 7A:
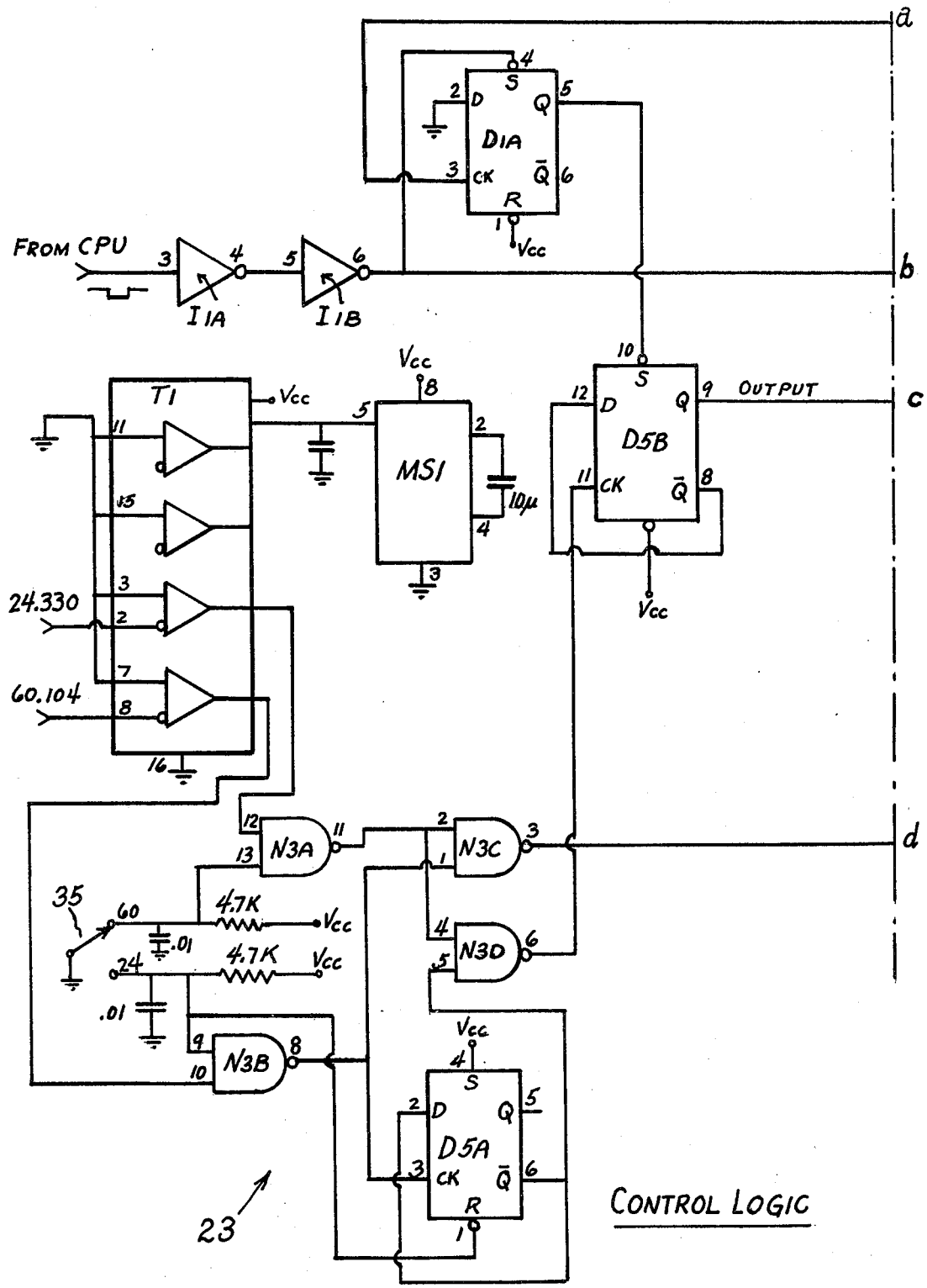
Figure 7C:
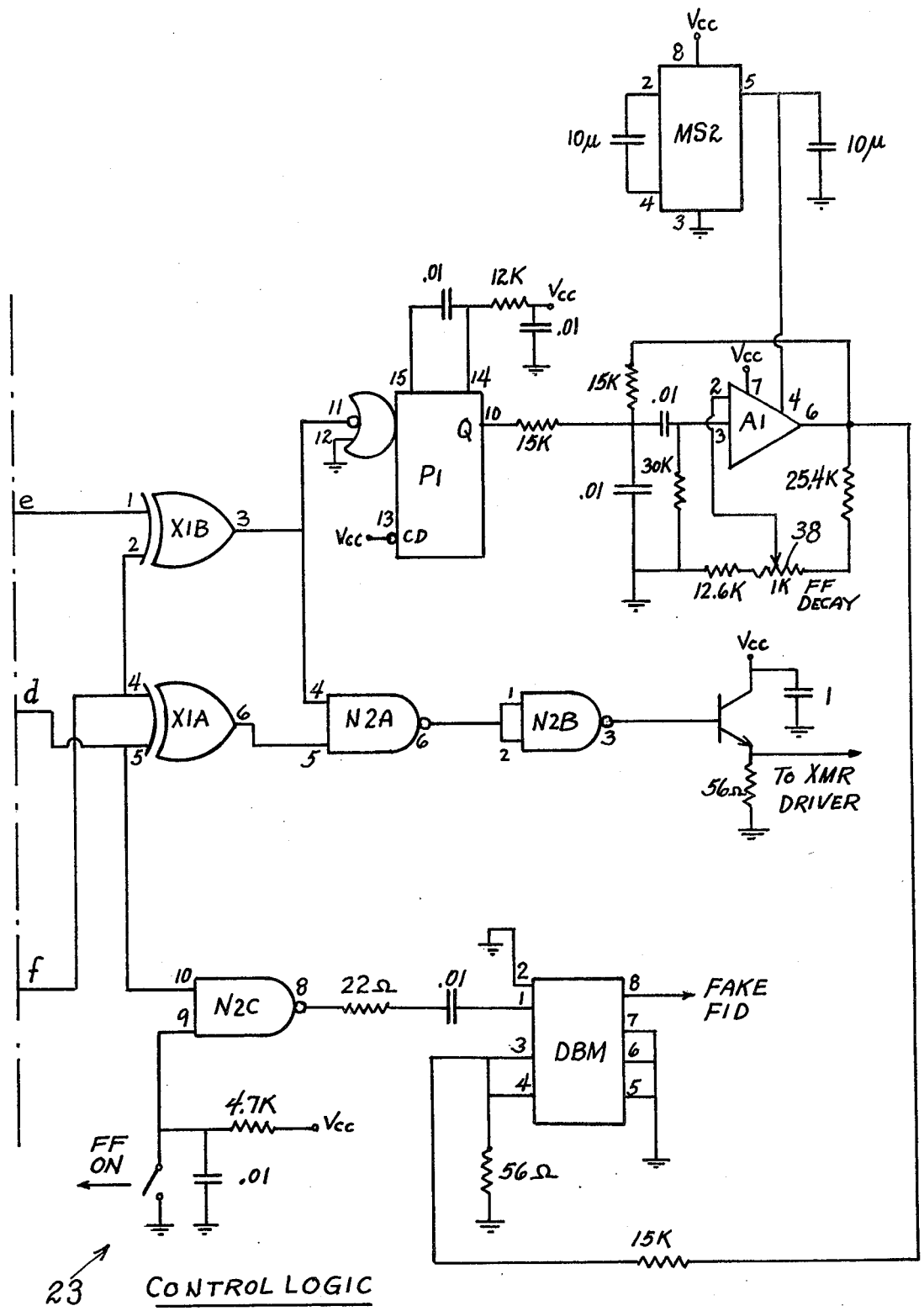

The logic diagram for the control unit 23 is shown in FIGS. 7A, 7B and 7C. Inputs to this unit (see FIG. 7A) include:

a. CPU transmit command (logic "0" for transmit).
b. 24.33 MHz or 60.10 MHz clock.

Outputs from this unit (see FIGS. 7B, 7C) include:

a. CPU Handshake (logic "0" for transmit, a change to logic "1" signals CPU 22 to acquire data, see FIG. 7B).
b. Receiver Gate (logic "1" during transmit time gates-off the receiver, see FIG. 7B).
c. Transmitter Driver (logic level signal for input to RF Driver 24 at 24.33 or 60.10 MHz, see FIG. 7C).
d. Fake FID (switchable, for test purposes, see FIG. 7C).

Figure 6:
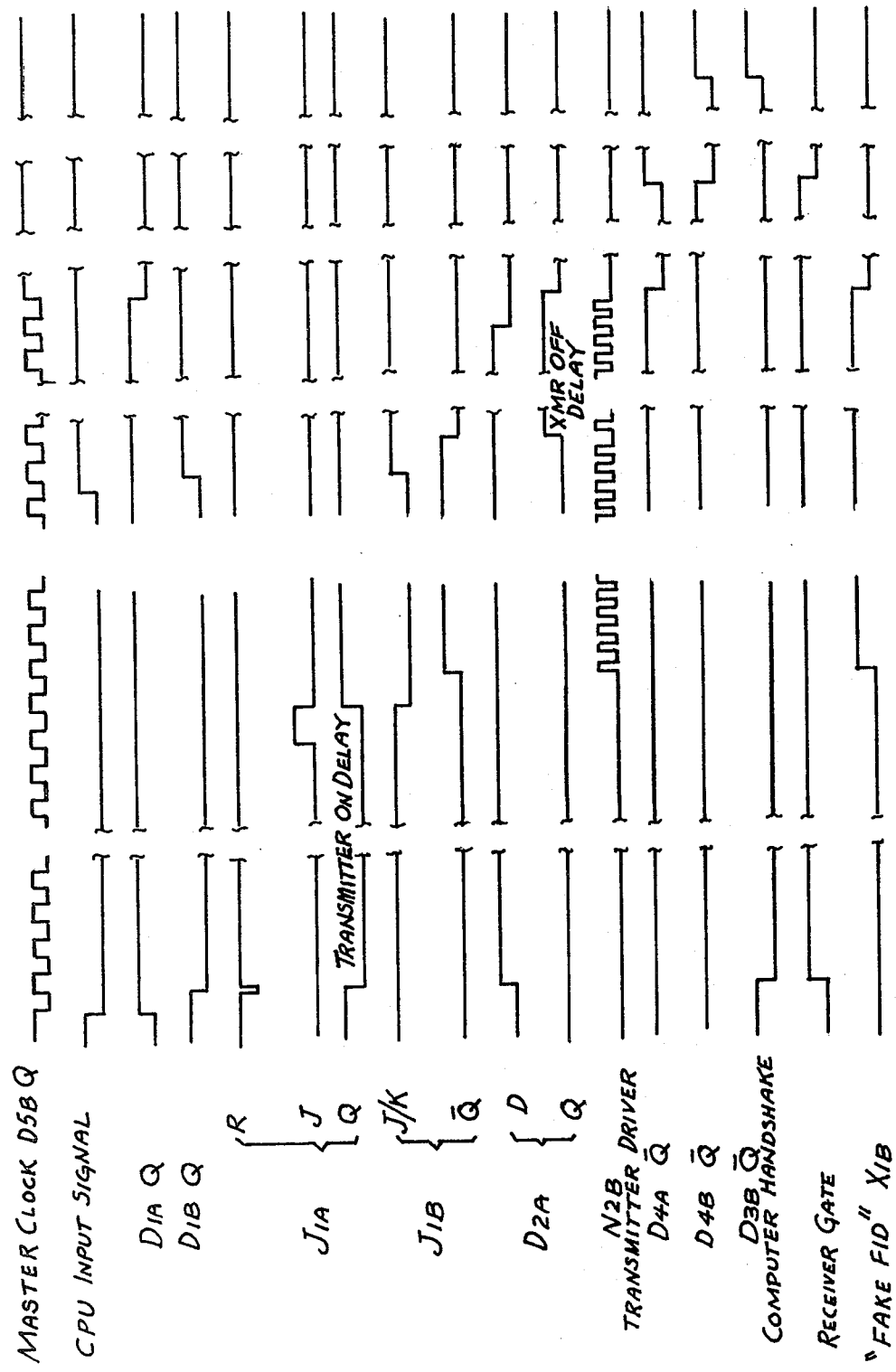
FIG. 6 is a system timing diagram for the apparatus of the present invention with a master clock operating at 24.33 MHz for phosphorus study, or at 60.104 MHz for proton study.

The timing diagram of FIG. 6 will aid in following the details of the operation of this unit as described hereinafter.

Referring to FIG. 7A, oscillator input to the logic unit 23 should be at either 24.33 or 60.10 MHz. To minimize noise and cross talk, both oscillators should not be connected to the input at the same time. Conversion of the zero-centered sine wave is accomplished by $T_1$, an ECL/TTL translator. In the "24" position of the clock switch, shown at 35, the 24.33 MHz is applied to the clock input of flip-flop $D_{5B}$, while in the "60" position of switch 35 the 60.10 MHz is divided by two before application to said clock input. To minimize noise during the received time, $D_{5B}$ is inhibited by $D_{1A}$ except during the transmit time. When released, the output of $D_{5B}$ provides either 12.17 MHz or 15.03 MHz as clock signals for subsequent timing operations. Any reference to clock times in the logic discussion which follows should be assumed to be this output of $D_{5B}$.

On the fall to "0" of the CPU input command at the start of a cycle, $D_{1A}$ is set and releases the set of $D_{5B}$, thus enabling clock pulses to be generated. $D_{1B}$ is then reset at the first rise of the clock and stays reset until the first rise of the clock after the CPU goes up. The delay of $I_{1C}$ and $I_{1D}$ causes NAND $N_{1A}$ to deliver a reset pulse to J-K flip-flop $J_{1A}$. The reset of $J_{1A}$ sets both $D_{3A}$ and $D_{3B}$, which cause the receiver gate to go up and the computer handshake to go down.

An adjustable time delay before transmit pulses are delivered is provided by counters $C_1$ and $C_2$ (see FIG. 7B) and is set by means of DIP switches 36. The number of clock cycles of delay is the complement of the jam-input to these counters plus one. For convenience, these switches are arranged such that open=1 and closed=0 to provide the complement. For example, if the switches are set 00010001, the delay before a carry-out pulse is delivered to $J_{1A}$ is 18 clock cycles or 1.48 μs, using the 24.33 MHz oscillator.

At the end of the count, $J_{1A}$ goes up. This level, combined with the high level at $\overline{Q}$ of $D_{1B}$ provided by $N_{1B}$, sets $\overline{Q}$ of $J_{1B}$ high on the next clock pulse. $X_{1B}$ (FIG. 7C) thus presents a high to one input of $N_{2A}$, since $D_{2A}$ is low at this time. With $D_{2A}$ low, $X_{1A}$ clocks through the 24.33 MHz (or 60.10 MHz) TTL level from $N_{3C}$ as the second input to $N_{2A}$. Following another inversion (to keep the transmitter drive low during receive time), the oscillator frequency appears at the transmitter drive output and remains until the CPU goes back up. It should be noted that when $J_{1A}$ went up, its $\overline{Q}$ loaded the jam inputs to the counters to prepare for the next cycle.

When exciting a relatively high Q system, the system can be made to "ring-down" more rapidly (to permit an earlier receive time) by applying a number of cycles of excitation 180° out of phase with the original excitation. This is accomplished with the second pair of counters $C_3$ and $C_4$. These counters and their associated DIP switches 37 are identical in operation to $C_1$ and $C_2$. Loading of the jam input occurs when $J_{1A}$ is low during transmit time. Unlike $C_1$ and $C_2$, which are enabled at all times, $C_3$ and $C_4$ count only until the carry-out occurs. At this point, $N_{1C}$ goes low and holds both counters disabled by virtue of holding their EP inputs low. The counters will stay disabled until the next "load" command from $J_{1A}$, which drives the carry-outs low.

The reverse count starts at the end (rise) of the CPU command, which enables the counters by setting $D_{1B}$ high. This also removes the reset from $D_{2A}$, which clocks through the "1" at its input and sets the output of $X_{1B}$ high since $J_{1B}\overline{Q}$ has been set low by $D_{1B}$. The input to $N_{2A}$ and the transmitter is now the same as during the transmit time except that the phase has been reversed by making one input of $X_{1A}$ high instead of low.

At the completion of the count, the counters are disabled, as previously described, and the "0" at $N_{1C}$ is clocked through $D_{2A}$. The rise of $\overline{Q}$ of $D_{2A}$ clocks through the "0" present at the input of $D_{1A}$, the output of which "sets" $D_{5B}$ and removes all clock signals.

$D_{4A}$ and $D_{4B}$ (FIG. 7B) are D flip-flops connected as adjustable R/C one-shots with a range of about 40 μs to 450 μs. At the completion of the reverse phase timing, the rise of $D_{2A}$ clocks through the "1" at the input of $D_{4A}$ and starts the timing cycle. When the capacitor charges to the point where transistor $Q_2$ conducts, $D_{4A}$ is reset and clocks the "0" through $D_{3A}$, which turns off the receiver gate signal. The rise of $\overline{Q}$ of $D_{4A}$ also starts the timing cycle of $D_{4B}$. After the delay of this one-shot, the computer handshake is returned to a high level by $D_{3B}$, indicating to the CPU that the transmit cycle is complete and data is ready to be acquired.

It follows from the previous discussion that the output of $X_{1B}$ is high during both the transmit and reverse phase times. The one-shot $P_1$ (FIG. 7C) is triggered by the fall of $X_{1B}$ at the end of the reverse phase and generates a pulse of about 40 μs duration. This pulse is used to perturb the high Q active filter consisting of $A_1$ and its associated components. The exponentially damped 1 kHz sine wave resulting at the output of $A_1$ is then used as one input to the double balanced mixer, DMB. When the FF switch is in the "on" (open) position, the 24.33 (or 60.10) MHz oscillator frequency is coupled into the other mixer input through $N_{2C}$. The resulting output of the mixer is double-sideband suppressed-carrier modulation of the oscillator frequency at 1 kHz with an exponential decay, which is available as a test signal at the end of each reverse phase time. The time constant of the exponential decay may be adjusted by changing the Q of the filter circuit using the 1000-ohm potentiometer 38.

DRIVER

Figure 8:
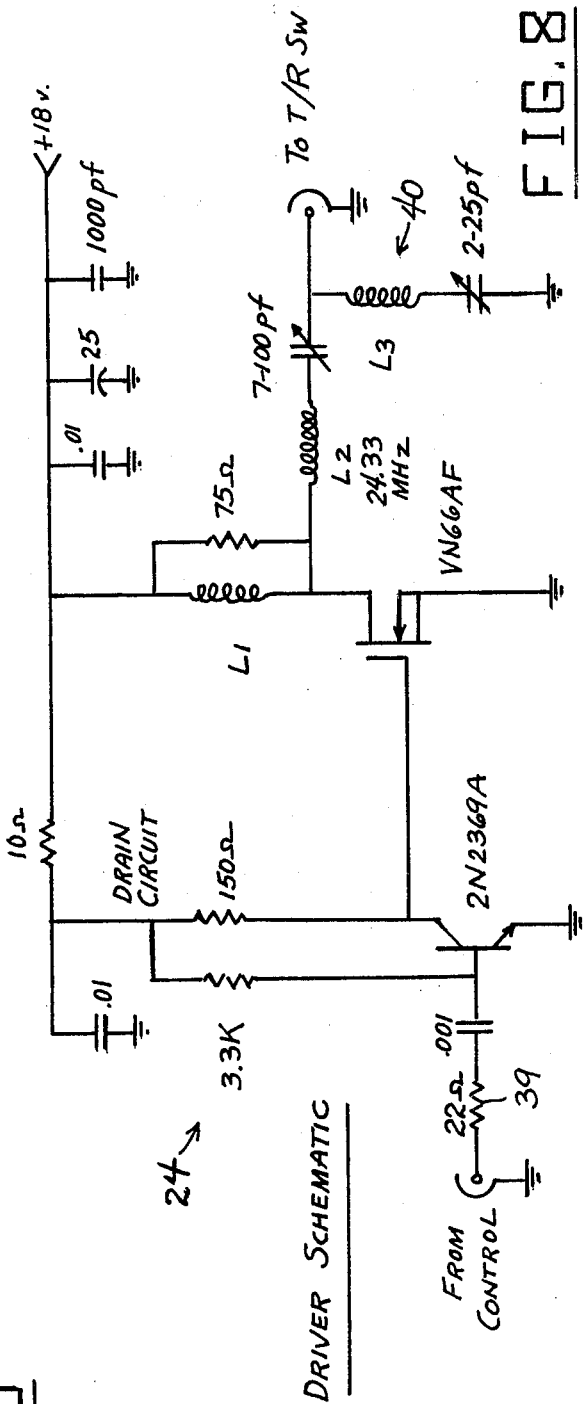
FIG. 8 is a wiring diagram of the driver component of the system of FIG. 4 or FIG. 5.

Referring to FIG. 8, the driver unit 24 illustrated therein has a design capability of driving a linear amplifier of 100 watts or more, but it has been found that 5 watts of RF power is adequate to provide spin axis rotation in the herein-described system. The driver unit 24 serves not only to provide power gain but also to render the logic level input more nearly sinusoidal. Input and output impedances are of the order of 50 ohms. Since the required duty cycle is very low, no effect needs to be made to heat-sink the output device, which is normally "off". The input stage is capacitively coupled with a base pull-up resistor 39 to prevent the output device from turning on in the absence of any input.

The output is coupled from the untuned drain circuit through a series-resonant circuit tuned to 24.33 MHz. Due to the essentially square nature of the input, very little even-harmonic energy is present in the output. A shunt trap 40 tuned to the third harmonic (72.99 MHz) serves to yield a reasonably pure sine wave at the output.

T/R SWITCH AND PRE-AMP

Figure 9:
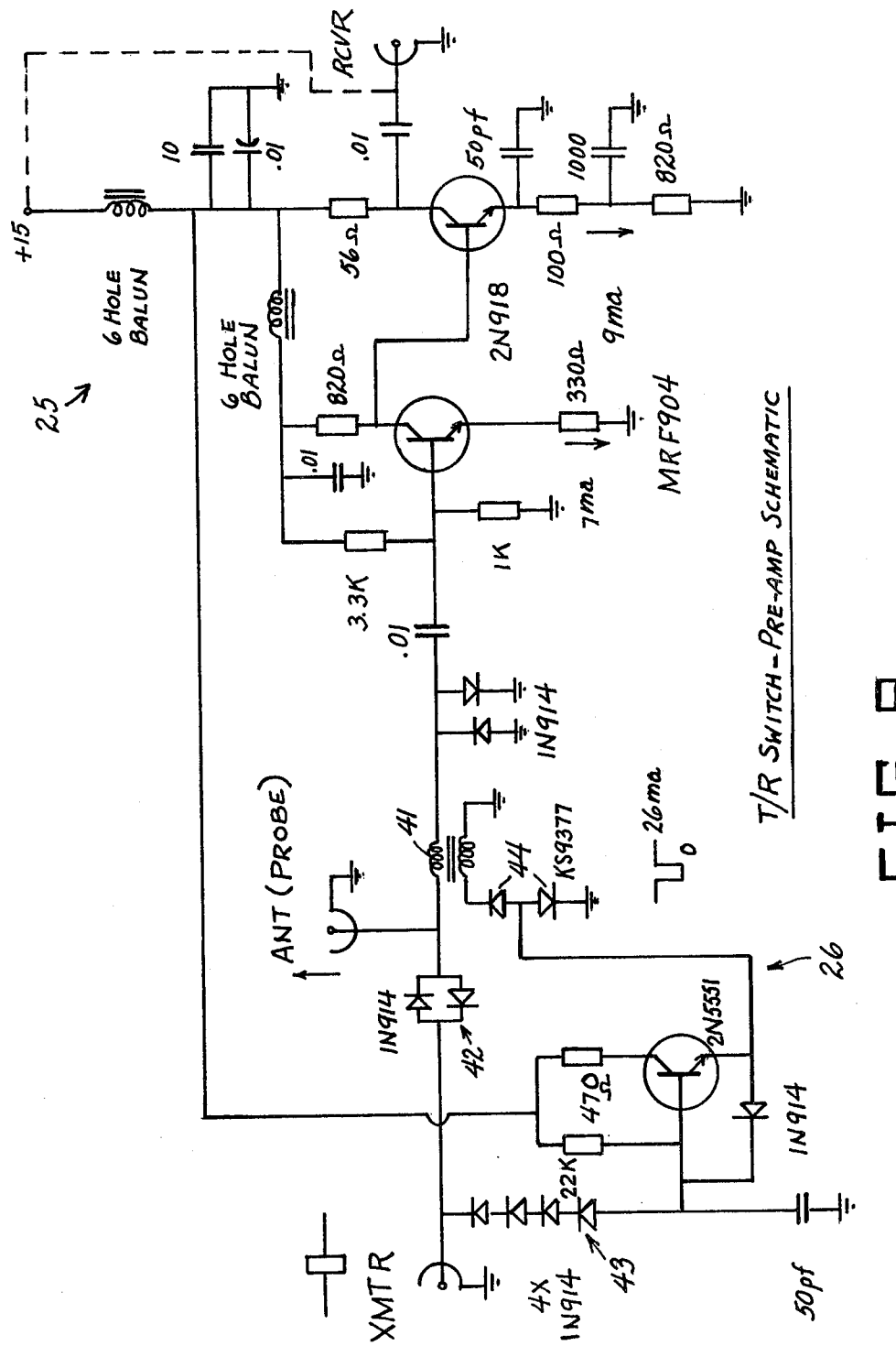
FIG. 9 is a wiring diagram of the transmitter-receiver switch and pre-amplifier component employed in FIG. 4 or 5.

Referring to FIG. 9, the T/R Switch and Pre-Amp 26,25 is designed to provide a relatively low noise figure of slightly more than 2 dB, with broadband response. During the receive time, a current of about 13 ma. biases both KS9377 diodes 44 "on", effectively shorting the secondary of the transmission line transformer 41 in the signal path. At the very low signal levels involved, the diodes 42 between the antenna and transmitter terminals and the diodes 43 shunting the signal path to ground are at a very high impedance level. Coupling of the signal at the probe coil 16 into the preamplifier 26 is thus accomplished with little attenuation. During the transmit burst, the transmitter RF is half-wave rectified and filtered by the series string of 1N914 diodes 43 and the 50 pf capacitor in the base circuit of the 2N5551 transistor, effectively cutting off the transistor and removing the forward bias from the diodes 44. The resulting high impedance of the transformer 41 permits the 1N914 diodes 43 in shunt to ground to limit the pre-amp input to about 0.6 volt.

RF AMPLIFIER

Figure 5:
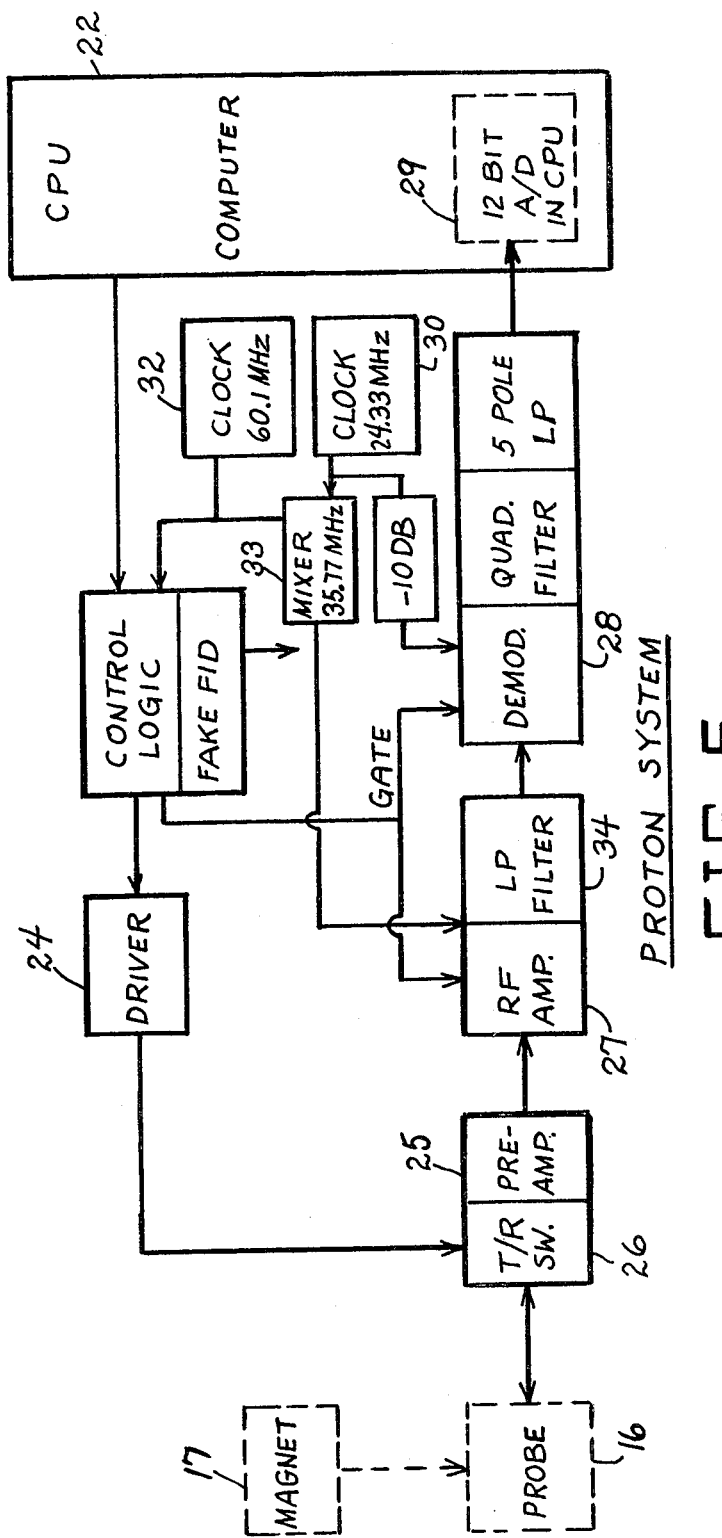
FIG. 5 is a block diagram showing the major components of a system similar to that of FIG. 4 but additionally modified for the study of proton free induction decays.
Figure 10:
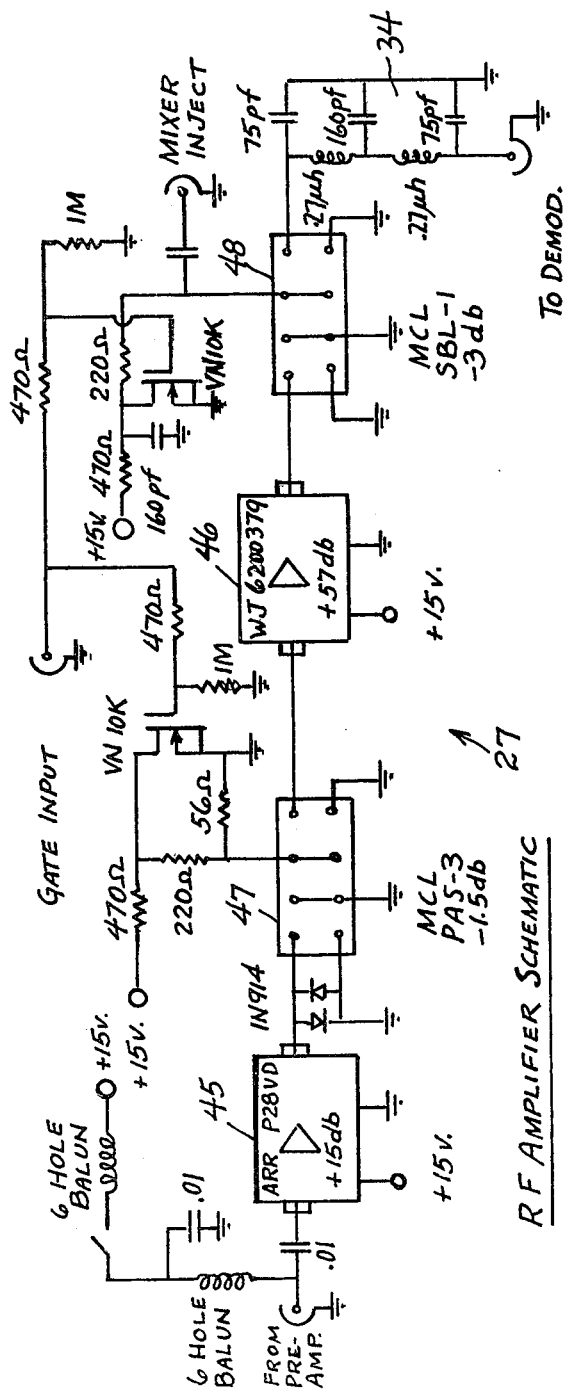
FIG. 10 is a wiring diagram of the RF amplifier and low-pass filter employed in FIG. 4 or 5.

Referring to FIG. 10, the RF amplifier module 27 is built around two commercially available amplifiers, namely, an Advanced Receiver Research model P28VD, shown at 45, with 15 dB of gain, and a Watkins-Johnson model 6200-379, shown at 46, which provides a further gain of 57 dB. A switchable choke-isolated supply of 15 volts is provided to allow powering of the preamplifier 25 through the input coaxial cable. Following the first 15 dB of gain, a current-controlled attenuator 47 (Mini Circuits Lab model PAS-3, or equal) is used to gate-off the receiver when the gate input is high during transit time. Similarly, a double balanced mixer 48 (Mini Circuits Lab model SBL-1, or equal) is used to provide the gate-off function following the 57 dB of gain. At the expense of slightly more insertion loss and harmonic content, use of the mixer as an attenuator provides a mixer injection port to permit heterodyning of the 60.10 MHz signal, as indicated in FIG. 5. A low-pass filter with a break frequency of about 30 MHz serves to attenuate the mixer harmonics and limit receiver bandwidth, said filter being shown at 34.

DETECTOR AND FILTERS

Figure 11B:
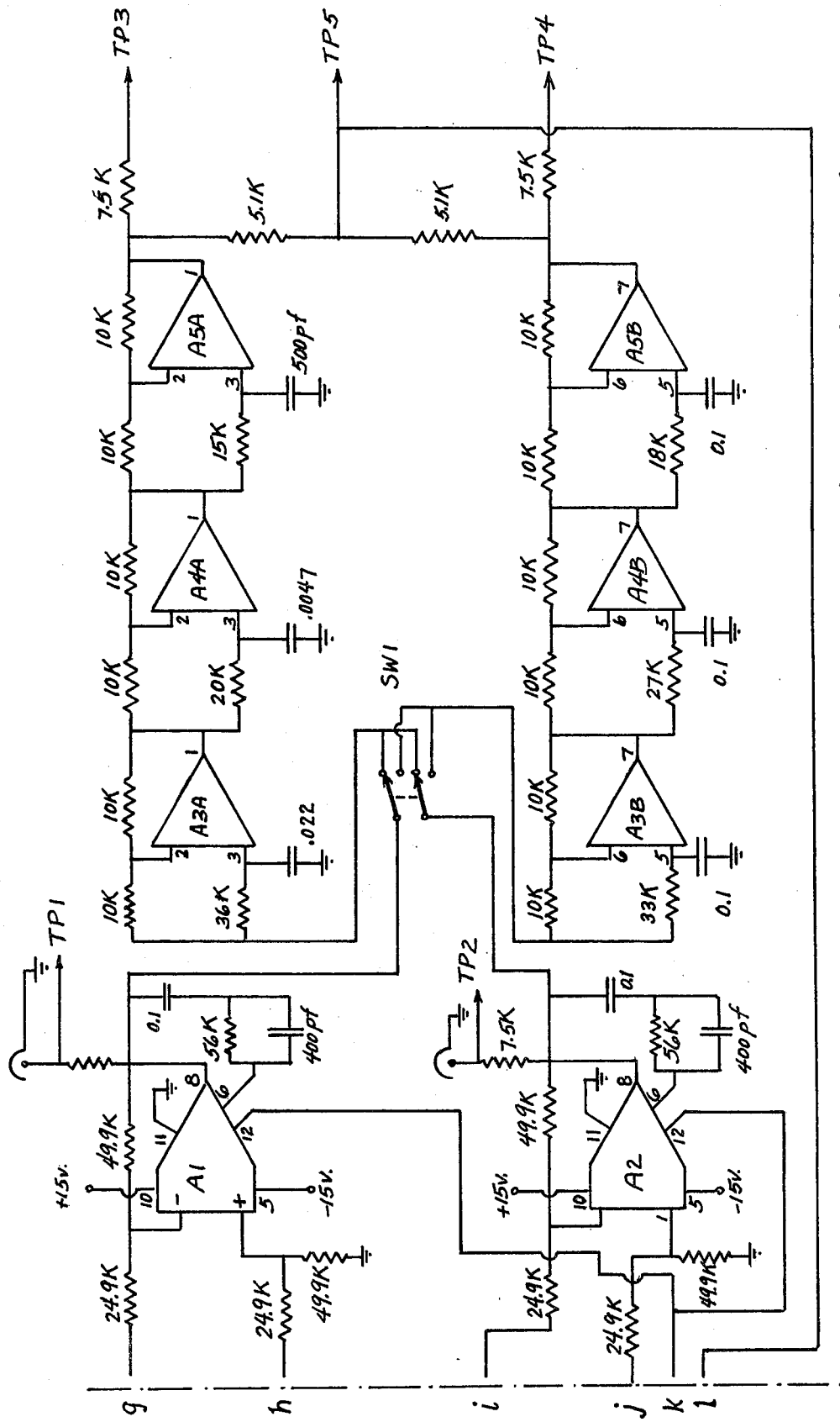

Referring to FIGS. 11A and 11B, the demodulator, quad filter and 5 pole LP section 28 comprises a subsection providing further gating, detection of the suppressed carrier modulation, and several filtering options. The input center frequency is 24.33 MHz for either phosphorus or proton signals and the output is scaled to provide ±10 volts to the A/D converter 29 in the CPU 22. Gating-off during transmit time is accomplished by using a current controlled limiter 50 (Watkins-Johnson L1 or equal) and a current controlled attenuator 51 (Mini Circuits Lab model PAS-3, or equal). The RF gain can be adjusted by varying the current in the PAS-3 diodes with the 2000-ohm potentiometer 52. These attenuators are followed by a capacitor-tapped parallel resonant circuit 53 to provide an impedance step-up from the 50-ohm input to an appropriate level for the phase sensitive detectors, as well as a zero-degree phase reference at 24.33 MHz.

For both phosphorus and proton detection, the 24.33 MHz master oscillator is applied to the local oscillator (LO) input of the phase splitter 54 (Mini Circuits Lab model PSCQ-2-50 or equal). About 10 dB of attenuation should typically be placed in series with the LO input to reduce the splitter outputs to about 160 mV RMS. The splitter 54 provides reference signals for the two demodulators $P_1$ and $P_2$, one of which is phased with the oscillator and the other of which is in quadrature. The detectors $P_1$ and $P_2$ (Motorola MC1496P, or equal) are monolithic balanced demodulators.

The balanced outputs are each returned to single-ended signals, with a gain of two, by the sample-and-hold amplifiers $A_1$ and $A_2$ (Analog Devices model AD582, or equal), shown in FIG. 11B. The receiver gate signal places each of these amplifiers in the hold mode during transmit time to prevent any residual receiver feedthrough from reaching the audio filter circuits.

Amplifiers $A_3$, $A_4$, and $A_5$ (Texas Instruments model TL072CP, or equal) comprise a quadrature filter. The break frequencies of $A_{3A}$, $A_{4A}$, and $A_{5A}$ are 260 Hz, 1675 Hz, and 20060 Hz, respectively. The network produces unity gain with a nearly linear phase shift in the audio range, passing through $-225°$ at 1 KHz. The break frequencies of $A_{3B}$, $A_{4B}$, and $A_{5B}$ are 49.85 Hz, 597 Hz, and 4853 Hz, respectively. This network has the same characteristics as the first except that the phase shift passes through $-315°$ at 1 kHz. For best results, the actual R/C network at each of the six noninverting inputs should be measured and selected to yield these break frequencies, as they are quite critical. Over the range from about 100 Hz to 10 Hz, the phase shift through the two networks differs by almost exactly 90°. Added to the 90° reference shift provided by the splitter 54, passive combination of these signals (at TP5) results in one sideband of the received signal achieving a gain of 6 dB and the other sideband canceling (actually about $-30$ dB). By selecting the path with switch SW1, either the upper or lower sideband may be removed and the signal-to-noise ratio improved. The option allowed by the switch SW1 permits operating with the LO frequency either above or below the Larmor precession frequency of the species of interest.

Aside from the usual carrier feedthrough adjustment provided by the two 100-ohm potentiometers 55,56, the only other circuit adjustment is that of the 1 $\mu$H choke in the input circuit 53. The simplest way to make this adjustment is to introduce the fake FID signal and observe TP1 and TP2 with an oscilloscope in the A-B mode. Since both sidebands are present in equal amounts, the signals at these test points should be equal and will cancel in the A-B mode when the L/C network is properly tuned to the center frequency. Since the LO frequency may be changed from time to time to accommodate variations in the static magnetic field, this adjustment should be checked periodically.

The four operational amplifiers $A_{6A}$, $A_{7A}$, $A_{7B}$, $A_{6B}$ (FIG. 11A) comprise a gain and offset adjustment and a 5-pole Butterworth filter. The break frequency of the filter is set at 10 kHz and the output is scaled to drive a ±10-volt A/D converter.

MIXER

Referring to FIG. 12, the mixer 33 employed in the embodiment of FIG. 5 is shown in detail. The mixer provides a means of using the spectrometer for real-time observation of the proton FID for the purpose of adjusting static field homogeneity. In this mode, spin axis rotation is provided by the driver pulse, which is derived from the 60.104 MHz oscillator, while detection is accomplished using the 24.33 MHz as a reference. To accomplish this, the received signal is mixed with a signal derived by mixing these two oscillators. The resulting signal entering the detector/filter circuit is at 24.33 MHz when the received signal is at 60.104 MHz.

Mixing of the two oscillator frequencies is accomplished using a double balanced mixer (Mini Circuits Lab model SRA-1, or equal). Input to the 60.104 port should be in the range of 0 to −5 dBm and input to the 24.33 MHz port should be in the range of +1 to +7 dBm. Both oscillators used in this embodiment should have a guaranteed minimum output level of +7 dBm with a 50-ohm load. The output impedance of these units should be of the order of 25–30 ohms. In either the phosphorus or proton configuration, each oscillator works into two parallel loads, since no splitters are used. In a typical embodiment, with a 25-ohm load, the 24.33 MHz oscillator output was measured to be +10.4 dBm and that of the 60.104 MHz unit was found to be +6 dBm. These levels will vary from unit to unit and should be measured with the actual units used. To reduce the levels to those appropriate for inputs to the mixer, a −6 dBm 50-ohm pad may be used at the 24.33 MHz input, and a −6 dBm 50-ohm pad may be used at the 60.104 MHz input.

A phase locked loop (Signetics NE 564 or equal) is used to filter unwanted mixer output components. Best results were obtained by setting the free-running frequency between 31.6 and 31.9 MHz. This frequency is set by adjusting the 5–22 pf trimmer between pins 12 and 13 of the phase locked loop, with both external oscillators disconnected. The loop gain is adjusted by means of the 10,000-ohm potentiometer 57 feeding current into pin 2. The voltage at this test point should range between 1.35 and 3.0 volts and should be as close to the upper limit as possible without producing spurious FM at the output or adversely affecting the locking range. For a typical unit, the voltage at the test point was set to 2.8 volts.

A unity gain non-inverting buffer 58 (National model LH0033CG, or equal) provides the interface between the phase locked loop and the subsequent load of the receiver mixer. The 50-ohm output level is appropriate to drive the receiver mixer-in port.

To operate a complete phosphorus and proton system as above described, two distinct reference oscillators are required. Both oscillators must be highly stable but slightly adjustable in frequency to accommodate slight variations in the static magnetic field. Several commercially available voltage-controlled crystal oscillators (Vectron Laboratories CO-276 series VCXO, or equal) are adequate for the application, with slight specification modification. The usual ±1% modulation linearity specification of the ±0.1% deviation can be relaxed easily to ±5%. However, a phase noise specification must be added to the standard specifications. An acceptable level from both system performance and manufacturer's standpoints is "SSB Noise/Hz less than or equal to −100 dBc at 1 kHz".

PROBE COIL ASSEMBLY

The probe 16 is substantially conventional in design except that provision must be made for the larger size of the receiver coils involved. For phosphorus studies, these coils are of the surface coil geometry, which consists of several turns of copper wire located immediately adjacent to the tissue to be studied. The size and number of the coils are limited by interturn capacitance, causing self-resonance at high frequencies, making the coil ineffective as a receiver. It is necessary to keep the size and number of turns small enough so that the self-resonance frequency is well above 24.3 MHz. Also, large-area coils tend to collect contaminating signals, and to pick up signals from outside the region of greatest magnetic field homogeneity and thereby produce relatively broad spectral lines.

Satisfactory results can be obtained with a 10-turn coil of 1 cm diameter, and with a 3-turn coil of 5 cm diameter. A 2-turn coil with an inner diameter of 3.75 cm and an outer diameter of 5 cm has also been found to be satisfactory.

FIG. 13 illustrates the equivalent circuit of a typical probe coil assembly, including matching capacitors $C_a$ and $C_b$.

A Faraday shield is used to shunt capacitance noise components to ground. This shield is an array of parallel conducting wires that are connected together at only one end. This connection point is electrically in contact with one side of the coil.

For effective transfer of the signal from the receiver coil to the preamplifier, it is necessary to match the input impedance of the coil to the characteristic impedance $Z_o$, of the coaxial cable. Ordinarily $Z_o$ will be 50 ohms. The inductance of the coil depends on the number of turns and the diameter. It will normally be in the range from 0.5 to 2 $\mu$H for the present application. The effective resistance R, arises from three sources: the intrinsic skin effect resistance of the coil (usually about a few hundred milliohms); leakage through the non-ideal dielectrics of the tuning capacitors, and the resistance corresponding to the losses associated with eddy currents induced in the patient. The total resistance from these effects will normally be in the range of 0.5 to 2.0 ohms. The signal originating in the patient's spin system is designated by $e_s$. The voltage $e_n$ is the noise signal. Ideally, $e_n$ will originate as Johnson noise from fluctuating noise current within the patient. In practice, $e_n$ will also contain components from the coil resistance, from leakage currents in the capacitor dielectrics, and from electromagnetic pickup. The best possible signal-to-noise ratio is determined in the probe as $e_s/e_n$.

The effect of the matching capacitors $C_a, C_b$ (FIG. 13) is to modify the signal and noise voltages as they appear at the output terminals of the probe. The exact expression for the transfer function $E_s/e_s$ is cumbersome, but at matching conditions we have simply $$E_s = e_s \sqrt{\frac{Z_o}{R}}$$

A similar expression holds for $e_n$. The variable capacitors $C_a$ and $C_b$ are adjusted to make the input impedance have a zero imaginary part and a real part equal to $Z_o$. This is the well-known criterion for optimum transfer of power from the source emf, $e_s$, to the output cable.

The expressions for $C_a$ and $C_b$ at the matching condition are also cumbersome but are given very closely by the approximate formulas $$C_b = \frac{1}{\omega^2 L} \sqrt{\frac{R}{Z_o}} \text{ and } C_a + C_b = \frac{1}{\omega^2 L}$$

where $\omega = 2\pi f$.

Note that the tuning condition is affected by the loss parameter R. Therefore, the tuning of the system will depend on how tight an electrical coupling exists between the receiver coil and the patient. Movement of the patient will normally require retuning of the probe to obtain optimum signal transfer.

The capacitance required to tune the probe will normally be between zero and 100 pf at the matching condition, and $C_b$ will normally be much less than $C_a$. If the inductance L is too large, $C_b$ may become so small that tuning is difficult because of stray capacitance effects. The capacitors used in the probe should be made from nonmagnetic materials so as not to distort the magnetic field in the region of the coil. They should have sufficient breakdown voltage to withstand the transmitter pulse without arcing. Both air and Teflon dielectric capacitors have been used successfully.

CPU REQUIREMENTS

The sequence of interactions between the CPU 22 and the balance of the above-described spectrometer is as follows:

a. The command from the CPU to start a sample cycle is a change from logic level 1 (+5 V.) to logic level 0 (0 V.).

b. The control logic responds to this command by providing a handshake signal, which changes from logic level 1 to logic level 0, to acknowledge receipt of the command.

c. The command to terminate the cycle from the CPU is a change from logic level 0 to logic level 1.

d. Following receipt of this command, the control logic provides a number of reverse phase cycles, releases the receiver gates, and signals the CPU that analog data is ready to be acquired by the CPU A/D converter 29 by setting the computer handshake from a logic level 0 to a logic level 1.

The required software should permit the user to:

a. Vary the number of samples to be acquired for averaging.

b. Vary the length of the CPU pulse sent to the control logic to establish the number of "transmit" cycles of RF applied normal to the static field.

c. Vary the repetition rate of the CPU pulses.

d. Provide continuous pulsing to permit adjustment of the spectrometer or static field homogeneity.

e. Perform a Fourier transform of the averaged data.

f. Display the transformed spectra.

Various modifications within the spirit of the invention may occur to those skilled in the art. It is intended that such modifications should be comprehended within the meaning and range of equivalents of the disclosed embodiments.

What is claimed is:

1. An analytic apparatus for obtaining metabolism information from a living body member comprising a hollow electromagnet having an inner space for receiving the body member, said space having means providing a substantially uniform high-intensity magnetic field and containing a probe coil with which the body member is engageable when received in said space, means generating a radio-frequency signal with a carrier frequency corresponding to the nuclear magnetic resonance frequency of a metabolite in the tissue of the body member, means to repetitively apply short pulses of said radio-frequency signal to said probe coil, whereby to excite nuclear resonance responses of the metabolite, radio frequency demodulation means tuned substantially to said resonance responses, control logic means controlling the application of said radio-frequency signal pulses to said probe coil, circuit means connecting the probe coil to the demodulation means and including switch means, said switch means having transistor controlled means to greatly increase the impedance between the probe coil and the demodulation means responsive to application of said radio-frequency signal pulses, means to substantially remove said impedance after a predetermined period of application of said short pulses to the probe coil, and signal conversion means connected to the output of said demodulation means for converting the output signals of the demodulation means into a representation of the intensities versus frequency shift of the free induction decays of the respective metabolite components of the tissue.

2. The analytic apparatus of claim 1, and wherein the carrier radio frequency corresponds substantially to the nuclear magnetic resonance frequency of phosphorus-31.

3. The analytic apparatus of claim 1, and wherein the carrier frequency is approximately 24.33 MHz.

4. The analytic apparatus of claim 1, and means to at times generate a simulated predetermined free induction decay signal, and means to apply said simulated decay signal to the input of said demodulation means for testing the apparatus.

5. The analytic apparatus of claim 4, and wherein said simulated decay signal comprises an exponentially decaying 1 kHz sine wave.

6. The analytic apparatus of claim 1, and wherein said control logic means includes adjustable means to provide a predetermined time delay before the enabling of the means to apply the short pulses of said radio-frequency signal to said probe coil.

7. The analytic apparatus of claim 1, and wherein the control logic means comprises a main control logic unit connected to the output of said radio-frequency signal generating means and a driver unit connected to and controlled by the output of the main control logic unit, said main control logic unit including circuit means for connecting said radio-frequency generating means to said driver unit.

8. The analytic apparatus of claim 7, and gating means connecting said main control logic unit to said demodulation means and disabling said demodulation means when the driver unit is enabled.

9. The analytic apparatus of claim 7, and timed means to enable said demodulation means and to disable said driver means during the operation of said demodulation means.

10. The analytic apparatus of claim 7, and a computer operatively connected to said main contol logic unit, said logic unit including means to furnish a first handshake signal to said computer when said demodulation means is disabled, and means to furnish a second handshake signal to said computer at the end of a timed period of radio-frequency signal delivery to the probe coil by the driver unit.

11. The analytic apparatus of claim 7, and wherein said main control logic unit includes means to provide an adjustable time delay before transmitter radio-frequency pulses are delivered to the probe coil by the driver unit.

12. The analytic apparatus of claim 7, and a computer operatively connected to said main control logic unit, said logic unit including means to furnish a low level handshake signal to the computer shortly after the start of an operating cycle in which the driver unit is enabled, means to gate-off the demodulation means during delivery of the radio-frequency pulses to the probe coil by the driver unit, means to terminate radio-frequency pulses to the driver unit at the end of a timed delivery period, means to gate-on the demodulation means shortly after completion of said delivery period, and means to then furnish a high level handshake signal to the computer to indicate that the transmit cycle is complete and data is ready to be acquired.

13. The analytic apparatus of claim 7, and wherein said switch means has a transmitter terminal connected to the output of said driver unit, a receiver terminal connected to said demodulation means, and a probe terminal connected to said probe coil, variable impedance means connected between said probe terminal and said receiver terminal, said impedance means being relatively low in impedance during receive times, conductive circuit means connected between said transmitter terminal and said probe terminal, and means to substantially increase the impedance of said variable impedance means responsive to a burst of radio-frequency energy applied to said transmitter terminal by said driver unit and furnished to the probe coil via said conductive circuit means and probe terminal, whereby to limit the input to said demodulation means during transmit times.

14. The analytic apparatus of claim 1, and wherein said switch means has a transmitter terminal connected to said radio-frequency generating means, a receiver terminal connected to said demodulation means, and a probe terminal connected to said probe coil, variable impedance means connected between said probe terminal and said receiver terminal, said impedance means being relatively low in impedance during receive times, conductive circuit means connected between said transmitter terminal and probe terminal, and means to substantially increase the impedance of said variable impedance means responsive to a burst of radio-frequency signal energy applied to said transmitter terminal and furnished to the probe coil via said conductive circuit means and probe terminal, wherein said variable impedance means comprises a transformer with its primary connected between the probe terminal and the receiver terminal, circuit means including a conducting transistor substantially defining a short circuit across the secondary of the transformer during receive times, and negative biasing circuit means connected to the base circuit of said transistor for cutting off said transistor responsive to the application of said burst of energy to the transmitter terminal, whereby to open said short circuit and produce a high impedance condition of said transformer primary so as to substantially isolate the probe terminal from the receiver terminal and to limit the input to said demodulation means during transmit times.

* * * * *